(12) United States Patent
Jung

(10) Patent No.: US 7,754,591 B2
(45) Date of Patent: Jul. 13, 2010

(54) METHOD FOR FORMING FINE PATTERN OF SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 673 days.

(21) Appl. No.: 11/672,680

(22) Filed: Feb. 8, 2007

(65) Prior Publication Data
US 2007/0202671 A1  Aug. 30, 2007

(30) Foreign Application Priority Data
Feb. 24, 2006  (KR) .................. 10-2006-0018145

(51) Int. Cl.
*H01L 21/22* (2006.01)
(52) U.S. Cl. .................. 438/551; 438/671; 438/717; 438/736; 438/737; 438/738; 438/739; 257/E21.038; 257/E21.232; 257/E21.314
(58) Field of Classification Search ............. 438/551, 438/671, 717, 736–739; 257/E21.038, E21.232, 257/E21.314
See application file for complete search history.

(56) References Cited

U.S. PATENT DOCUMENTS

| | | | |
|---|---|---|---|
| 4,436,583 A | 3/1984 | Saiki et al. |
| 4,863,833 A | 9/1989 | Fukuyama et al. |
| 5,212,043 A | 5/1993 | Yamamoto et al. |
| 5,256,248 A | 10/1993 | Jun |
| 5,750,680 A | 5/1998 | Kim et al. |
| 6,051,678 A | 4/2000 | Kim et al. |
| 6,132,926 A | 10/2000 | Jung et al. |
| 6,225,020 B1 | 5/2001 | Jung et al. |
| 6,235,447 B1 | 5/2001 | Lee et al. |
| 6,235,448 B1 | 5/2001 | Lee et al. |

(Continued)

FOREIGN PATENT DOCUMENTS

GB  2 345 286 A  7/2000

(Continued)

OTHER PUBLICATIONS

Jung, Jae Chang, U.S. Appl. No. 11/672,676, filed Feb. 8, 2007 for "Method for Forming Fine Pattern of Semiconductor Device,".

*Primary Examiner*—Andy Huynh
(74) *Attorney, Agent, or Firm*—Townsend and Townsend and Crew LLP

(57) ABSTRACT

A method for forming a fine pattern of a semiconductor device include forming a stack structure including a $1^{st}$ layer hard mask film to a $n^{th}$ layer hard mask film (n is an integer ranging from 2 or more) over an underlying layer formed over a semiconductor substrate. The $n^{th}$ layer hard mask film, the top layer, is selectively etched to obtain a first hard mask pattern of the $n^{th}$ layer. A second hard mask pattern of the $n^{th}$ layer is formed between the first hard mask patterns of the $n^{th}$ layer. A $(n-1)^{th}$ layer hard mask film is etched using the first and the second hard mask pattern of the $n^{th}$ layer as etching masks. The (c) step to the (d) step repeat to form the first and the second hard mask patterns of the $1^{st}$ layer over the underlying layer. And, the underlying layer is etched using the first and second hard mask patterns of the $1^{st}$ layer as etching masks.

25 Claims, 6 Drawing Sheets

U.S. PATENT DOCUMENTS

| | | | |
|---|---|---|---|
| 6,696,365 B2 * | 2/2004 | Kumar et al. | 438/706 |
| 6,716,761 B2 | 4/2004 | Mitsuiki | |
| 6,974,651 B2 * | 12/2005 | Choi | 430/5 |
| 7,026,253 B2 * | 4/2006 | Lee | 438/717 |
| 7,037,850 B2 * | 5/2006 | Lee et al. | 438/725 |
| 7,078,351 B2 * | 7/2006 | Chiu et al. | 438/736 |
| 7,087,533 B2 * | 8/2006 | Chung | 438/720 |
| 7,291,446 B2 * | 11/2007 | Mosden et al. | 430/316 |
| 7,375,017 B2 * | 5/2008 | Ho et al. | 438/592 |

FOREIGN PATENT DOCUMENTS

| | | |
|---|---|---|
| JP | 54-155771 | 12/1979 |
| JP | 02-266517 | 10/1990 |
| JP | 2002319573 A | 10/2002 |
| JP | 2004-303870 A | 10/2004 |
| KR | 10-1993-0001301 | 1/1993 |
| KR | 10-2005-0052658 A | 6/2005 |
| KR | 100694412 B1 | 3/2007 |
| KR | 100744683 B1 | 7/2007 |
| WO | WO 96/37526 | 11/1996 |
| WO | WO 97/33198 | 9/1997 |

* cited by examiner

METHOD FOR FORMING FINE PATTERN OF SEMICONDUCTOR DEVICE

CROSS-REFERENCES TO RELATED APPLICATIONS

The present application claims priority to Korean patent application number 10-2006-0018145, filed on Feb. 24, 2006, which is incorporated by reference in its entirety.

BACKGROUND OF THE INVENTION

The present invention relates to a method for forming a fine pattern in a semiconductor device.

As the demand for smaller semiconductor devices increases, patterns are formed closer together on a semiconductor substrate. Resist and exposers have been developed for obtaining fine patterns on a semiconductor substrate.

In photo-lithography, an exposure process utilizes KrF (248 nm) or ArF (193 nm) as a light source. Certain exposure processes utilize a short wavelength light source such as $F_2$ (157 nm) or EUV (13 nm). However, when a new light source is applied, a new exposure process is required. As a result, manufacturing costs increase and a focus depth width is degraded. In addition, since the resolution of the short wavelength light source is limited to 0.1 μm, it is difficult to form the fine patterns required for highly integrated semiconductor devices.

SUMMARY OF THE INVENTION

A method for forming a fine pattern of a semiconductor device includes forming a stack structure including a $1^{st}$ layer hard mask film to a $n^{th}$ layer hard mask film (n is an integer ranging from 2 or more) over an underlying layer formed over a semiconductor substrate. The $n^{th}$ layer hard mask film, the top layer, is selectively etched to obtain a first hard mask pattern of the $n^{th}$ layer. A second hard mask pattern of the $n^{th}$ layer is formed between the first hard mask patterns of the $n^{th}$ layer. A $(n-1)^{th}$ layer hard mask film is etched using the first and the second hard mask pattern of the $n^{th}$ layer as etching masks. The forming-the-hard-mask-pattern step repeats to form the first and the second hard mask patterns of the $1^{st}$ layer over the underlying layer. And, the underlying layer is etched using the first and second hard mask patterns of the $1^{st}$ layer as etching masks.

The n is an integer ranging from 2 to 7, more specifically, the n is 3.

The method of forming the second hard mask pattern further comprises forming a second hard mask film of the $n^{th}$ layer over the first hard mask pattern of the $n^{th}$ layer and planarizing the second hard mask film to expose the first hard mask pattern of the $n^{th}$ layer. The first hard mask pattern is partially removed from the top surface. A first trimming process is performed on the second hard mask film of the $n^{th}$ layer to form a second hard mask pattern of the $n^{th}$ layer having slope sidewall. A second trimming etching process is performed on the resulting structure to form a second hard mask pattern of the $n^{th}$ layer between the adjacent first hard mask patterns of the $n^{th}$ layer.

Specifically, a method for forming a fine pattern of a semiconductor device comprises: forming a stack structure of a hard mask film of a $n^{th}$ layer (n is an integer ranging from 2 or more) over an underlying layer formed over a semiconductor substrate; selectively etching a first hard mask pattern of the $n^{th}$ layer which is the top layer to form a first hard mask pattern of the $n^{th}$ layer having a width of W1 and a thickness of T1; forming a second hard mask film of the $n^{th}$ layer over the first hard mask pattern of the $n^{th}$ layer and planarizing the second hard mask film to exposed the first hard mask pattern; removing the first hard mask pattern by a thickness of T2 from the top surface (0<T2<T1); performing a first trimming process on the second hard mask film of the $n^{th}$ layer until the first hard mask film of the $(n-1)^{th}$ layer is exposed to form a second hard mask pattern of the $n^{th}$ layer having slope sidewall; performing a second trimming process on the second hard mask pattern to separate the second hard mask pattern of the $n^{th}$ layer from the first hard mask pattern of the $n^{th}$ layer and form a third hard mask pattern having a width of W2; patterning the first hard mask film of the $(n-1)^{th}$ layer using the first and the third hard mask patterns of the $n^{th}$ layer as etching masks; repeating the hard-mask-pattern-forming-process until the underlying layer is exposed to form a first hard mask pattern of the $1^{st}$ layer having a width of W5 and a third hard mask pattern of the 1st layer having a width of W6; and patterning the underlying layer using the first and second hard mask patterns of the 1st layer as etching masks.

DESCRIPTION OF THE SPECIFIC EMBODIMENT

The present invention will be described in detail with reference to the accompanying drawings.

Figure 1A:
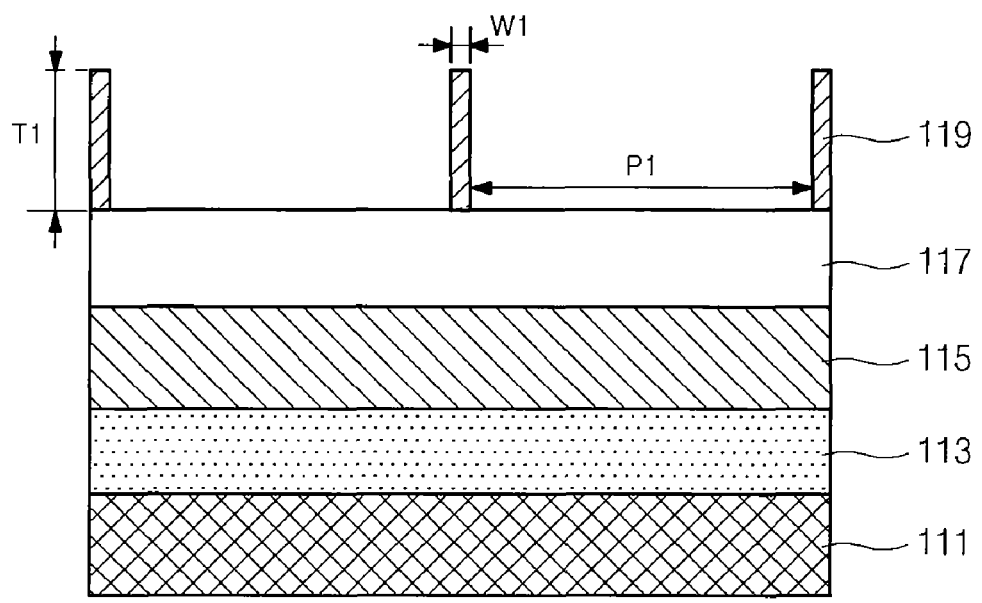
FIGS. 1a through 1k are cross-sectional diagrams illustrating a method for forming a fine pattern of a semiconductor device according to an embodiment of the present invention.

FIG. 1a shows a stack structure including a first hard mask film 115 of a $1^{st}$ layer, a first hard mask film 117 of a $2^{nd}$ layer sequentially formed over an underlying layer 113 of a semiconductor substrate 111. A first hard mask pattern 119 of a $3^{rd}$ layer having a width of W1 and a thickness of T1 are formed the first hard mask film 117 of a $2^{nd}$ layer. Also, the first hard mask pattern 119 of a $3^{rd}$ layer are formed with a pitch of P1. The underlying layer 113 is formed of a material for a word line, a bit line or a metal line.

The first hard mask film 115 of the $1^{st}$ layer, the first hard mask film 117 of the $2^{nd}$ layer and the first hard mask pattern 119 of the $3^{rd}$ layer are formed from one of; polysilicon, an oxide film, a nitride film, a metal or combinations thereof. The first hard mask film 115 of the $1^{st}$ layer, the first hard mask film 117 of the $2^{nd}$ layer and the first hard mask film 119 of the $3^{rd}$ layer are formed with a material having a different etching selectivity that is different than the etching selectivity of the adjacent hard mask film. For example, the first hard mask film of the $1^{st}$ layer is formed from a polysilicon oxide film, the first hard mask film of the $2^{nd}$ layer is formed from tungsten, and the first hard mask pattern of the $3^{rd}$ layer is formed from a polysilicon film.

The first hard mask pattern of the $3^{rd}$ layer is formed by forming a photoresist film over the first hard mask film of the $3^{rd}$ layer. An exposure process is performed with an exposure mask positioned over the photoresist film. A developing process is performed to form a photoresist pattern. The hard mask film of the $3^{rd}$ layer is etched using the photoresist pattern as an etching mask. The photoresist pattern is then removed.

In the exposure process for forming the first hard mask pattern of the $3^{rd}$ layer, the pattern is designed to have the minimum line-width and the minimum pitch, and an over-exposure process for increasing exposure energy and exposure time is performed to expose the side surface of the photoresist film located in a shading region of the exposure mask. The photoresist pattern are formed at the smallest spacing interval that can be obtained by a lithography process. As a result, the width W1 of the first hard mask pattern 119 of the $3^{rd}$ layer is a resolution-size-limit patternable by a conventional lithography process.

Figure 1B:
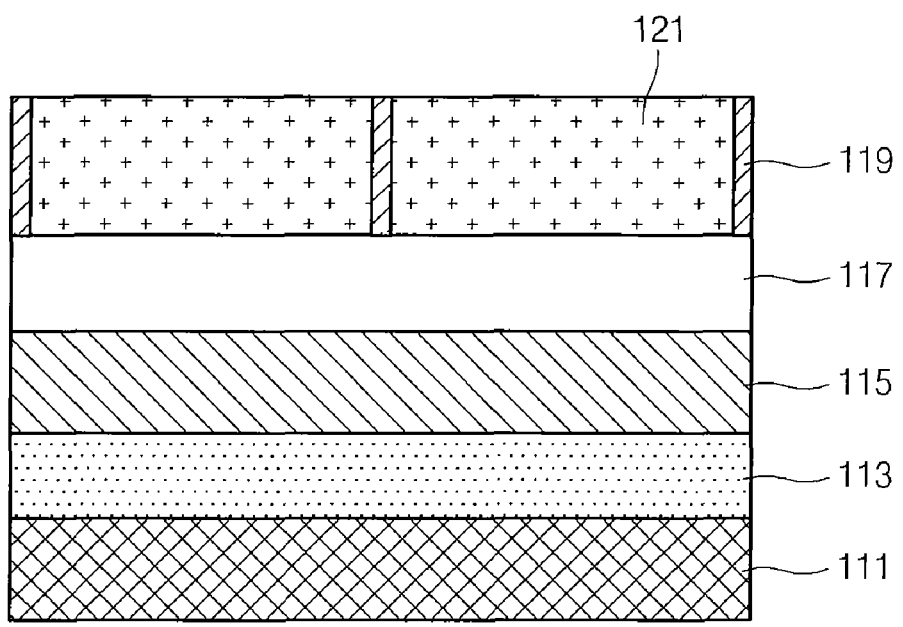

As shown in FIG. 1b a second hard mask film 121 of the $3^{rd}$ layer is formed over and between the first hard mask pattern 119 of the $3^{rd}$ layer. A planarizing process is performed on the second hard mask film 121 of the $3^{rd}$ layer until the hard mask pattern 119 of the $3^{rd}$ layer is exposed.

The second hard mask film of the $3^{rd}$ layer is formed with a material having an etching selectivity that is different than the etching selectivity of the first hard mask film of the $3^{rd}$ layer. The second hard mask film is formed of an organic film or an inorganic film.

The organic films may include a photoresist film or an anti-reflection film, which may be formed by a spin-coating process. For example, the photoresist film that has been disclosed in Korean Patent Publication Nos. 1984-0003145 and 1985-0008565, U.S. Pat. No. 5,212,043, WO 97/33198, WO 96/37526, U.S. Pat. No. 5,750,680, U.S. Pat. No. 6,051,678, GB 2,345,286 A, U.S. Pat. No. 6,132,926, U.S. Pat. No. 6,225,020 B1, U.S. Pat. No. 6,235,448 B1 and U.S. Pat. No. 6,235,447 B1. Specifically, the base resin of the photoresist film includes a compound selected from the group consisting of a polyvinylphenol type, a polyhydroxystyrene type, a polynorbornene type, a polyadamantyl type, a polyimide type, a polyacrylate type, a polymethacrylate type, a polyfluorine type and combinations thereof. More specifically, the base resin of the photoresist film includes a polymer selected from the group consisting of a ROMA-type polymer (including a Ring-Opened Maleic Anhydride repeating unit); COMA-type polymer (including Cyclo-Olefin repeating unit, Maleic Anhydride repeating unit and methacrylate or acrylate repeating unit); and hybrid-type polymer thereof. The anti-reflection film is formed of a resin selected from the group consisting of a phenylamine resin, a melamine derivative resin, an alkali soluble resin, an acrylate resin, an epoxy resin and combinations thereof.

The inorganic film is an oxide film, a nitride film or a polysilicon layer.

Figure 1C:
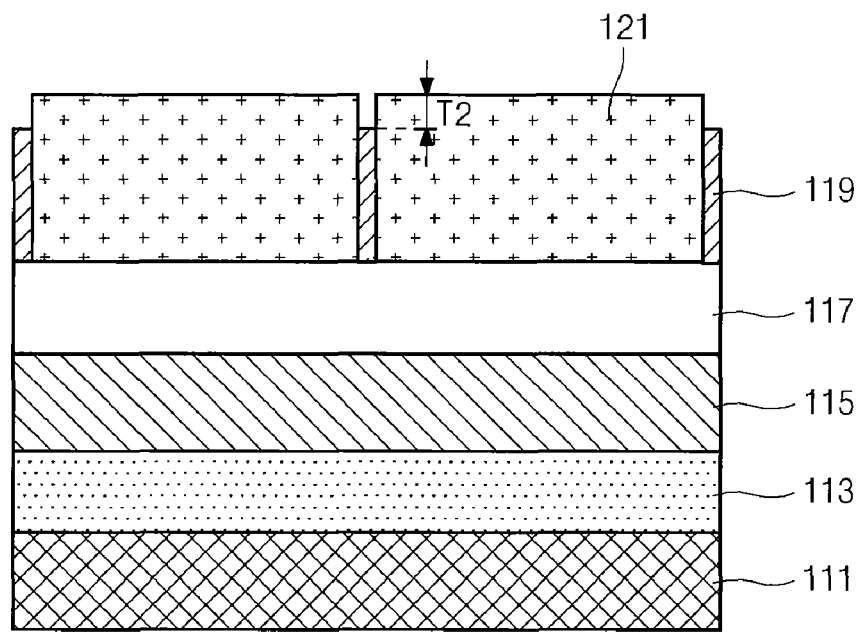

FIG. 1c shows the first hard mask pattern of the $3^{rd}$ layer removed by a thickness T2 from the top surface by an etchback process. Here, T2 is $0<T2\leq(1/3)T1$. The removing process is performed using an etching gas selected from the group consisting of $CF_4$, $Cl_2$, HBr and combinations thereof. For example, when the second hard mask film of the $3^{rd}$ layer is an organic film and the first hard mask film of the $3^{rd}$ layer is a polysilicon film, $CF_4$ is used as an etching gas.

Figure 1D:
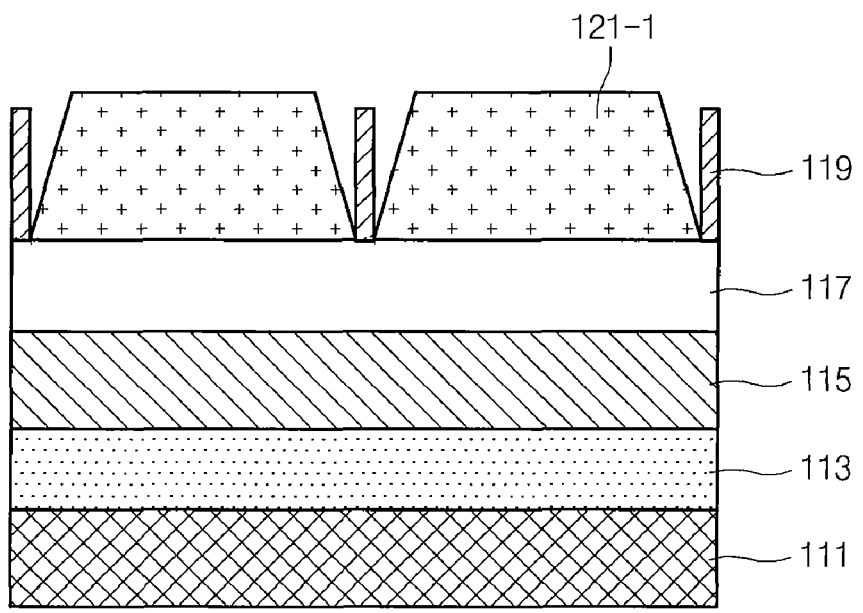

FIG. 1d shows a second hard mask pattern 121-1 of the $3^{rd}$ layer having a slope sidewall obtained by performing a first trimming etching process on the second hard mask film of the $3^{rd}$ layer of FIG. 1c.

In the first trimming process, the etching rate of second hard mask pattern of the $3^{rd}$ layer is approximately nine to ten times faster than the etching rate of the first hard mask pattern of the $3^{rd}$ layer. The first trimming process is performed using an etching gas selected from the group consisting of $CF_4$, $N_2$, $O_2$, Ar, H and combinations thereof. Specifically, the first trimming process is performed using an etching gas including $O_2$, $CF_4$ and Ar as main components, with a concentration ratio of $O_2:CF_4:Ar$ of $1:7\sim10:25\sim45$.

As an example, when the first hard mask pattern of the $3^{rd}$ layer is a polysilicon layer, and the second hard mask film of the $3^{rd}$ layer is an organic film and specifically a photoresist film, the first trimming process is performed using an etching gas which includes $O_2$ of 3~4 sccm, $CF_4$ of 30 sccm and Ar of 130 sccm.

The first trimming process is performed to etch the second hard mask film of the $3^{rd}$ layer until the first hard mask film of the $2^{nd}$ layer is exposed. Since the side surface of the second hard mask film of the $3^{rd}$ layer is exposed by the removing process, the corner of the exposed second hard mask film of the $3^{rd}$ layer is affected by the etching gas so that the side of the second hard mask pattern of the $3^{rd}$ layer becomes slope type.

Figure 1E:
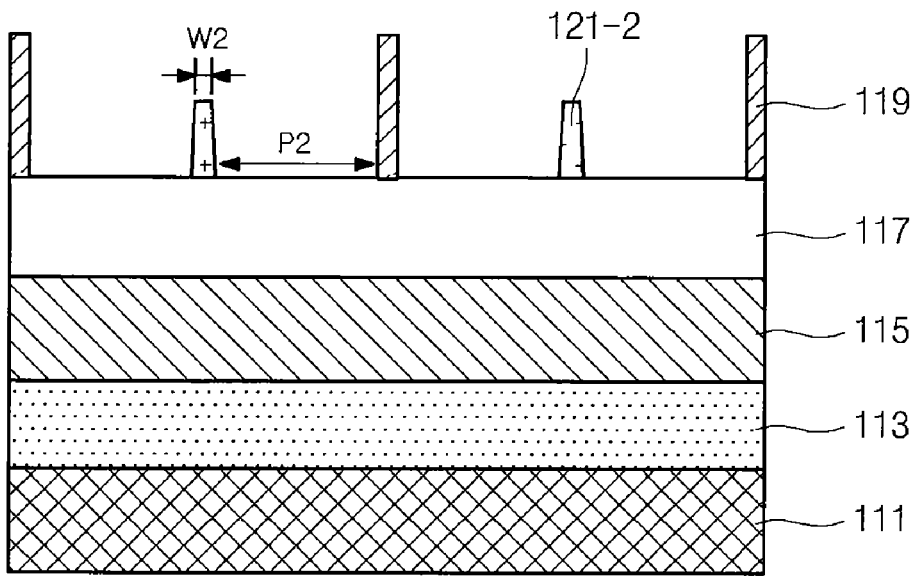

FIG. 1e shows the third hard mask pattern 121-2 of the $3^{rd}$ layer formed between the first hard mask pattern of the $3^{rd}$ layer.

In the second trimming process, an etching speed of second hard mask pattern of the $3^{rd}$ layer is approximately nine to ten times faster than the etching speed of the first hard mask pattern of the $3^{rd}$ layer. The second trimming process is performed using an etching gas selected from the group consisting of $CF_4$, $N_2$, $O_2$, Ar, H and combinations thereof. Specifically, the second trimming process is performed using an etching gas including $O_2$, $CF_4$ and Ar as main components, with a concentration ratio of $O_2:CF_4:Ar$ of $1:40\sim80:25\sim50$.

As an example, when the first hard mask pattern of the $3^{rd}$ layer is a polysilicon layer, and the second hard mask film is an organic film and specifically a photoresist film, the second trimming process is performed using an etching gas which includes $O_2$ of 1~2 sccm, $CF_4$ of 80 sccm and Ar of 50 sccm.

After the second trimming process, the width W2 of the third hard mask pattern is same as the width (W1) of the first hard mask pattern of the $3^{rd}$ layer. And the first hard mask pattern and the third hard mask pattern of the $n^{th}$ layer are formed by a pitch of P2. Here, P2 is (1/2)P1.

Figure 1F:
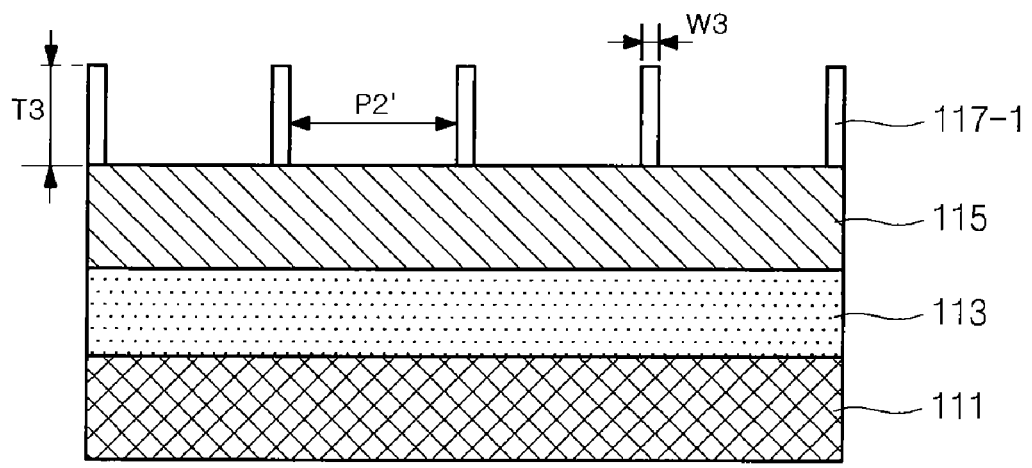

FIG. 1f shows a first hard mask pattern 117-1 of the $2^{nd}$ layer having a width W3 and a thickness of T3 obtained by patterning the first hard mask film 117 of the $2^{nd}$ layer. The pattering process is performed using a general etching process using the first hard mask pattern 119 of the $3^{rd}$ layer and the third hard mask pattern 121-2 of the $3^{rd}$ layer as etching masks.

The width W3 of the first hard mask pattern 117-1 of the $2^{nd}$ layer is same as the width (W1) of the first hard mask pattern of the $3^{rd}$ layer. Also, the first hard mask pattern 117-1 of the $2^{nd}$ layer are formed with a pitch of P2'(P2'=P2).

Figure 1G:
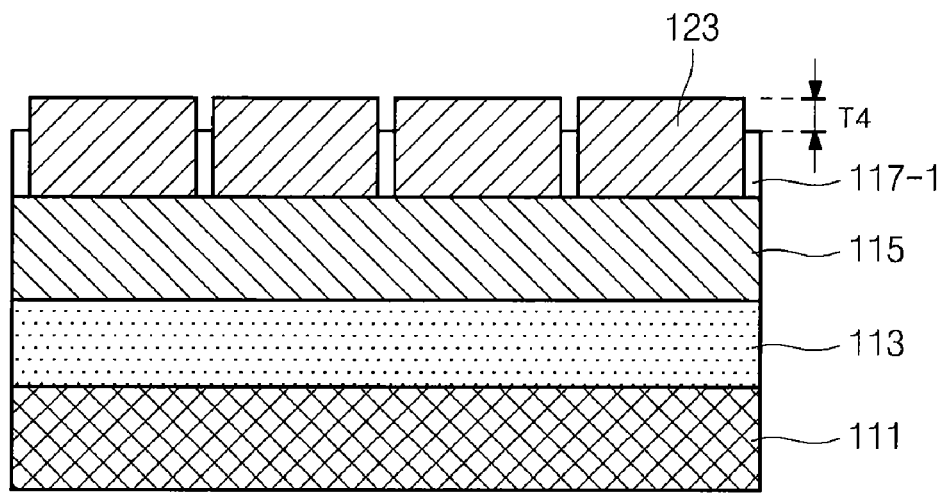

FIG. 1g shows a second hard mask film 123 of the $2^{nd}$ layer formed over and between the first hard mask pattern 117-1 of the $2^{nd}$ layer.

The second hard mask film of the $2^{nd}$ layer is then planarized to expose the first hard mask film of the $2^{nd}$ layer. The first hard mask film of the $2^{nd}$ layer is removed by a thickness T4 from the top surface by an etch-back process. Here, T4 is $0<T4\leq(1/3)T3$.

The second hard mask film of the $2^{nd}$ layer is formed with a material having an etching selectivity that is different than the etching selectivity of the first hard mask pattern of the $2^{nd}$ layer. The second hard mask film is formed of an organic film or an inorganic film.

The organic films may include a photoresist film or an anti-reflection film, which may be formed by a spin-coating process. For example, the photoresist film includes a compound selected from the group consisting of polyvinylphenol, polyhydroxystyrene, polynorbornene, polyadamantyl, polyimide, polyacrylate, polymethacrylate, polyfluorine and combinations thereof, as a base resin. The anti-reflection film is selected from the group consisting of a phenylamine resin, a melamine a derivative resin, an alkali soluble resin, an acrylate resin, an epoxy resin and combinations thereof.

The inorganic film is an oxide film, a nitride film or a polysilicon layer.

The removing process of a thickness T4 of the first hard mask pattern 117-1 of the 2$^{nd}$ layer is performed under the same condition as that of the first hard mask film of the 3$^{rd}$ layer. More specifically, the removing process is performed using an etching gas selected from the group consisting of $CF_4$, $Cl_2$, HBr and combinations thereof.

Figure 1H:
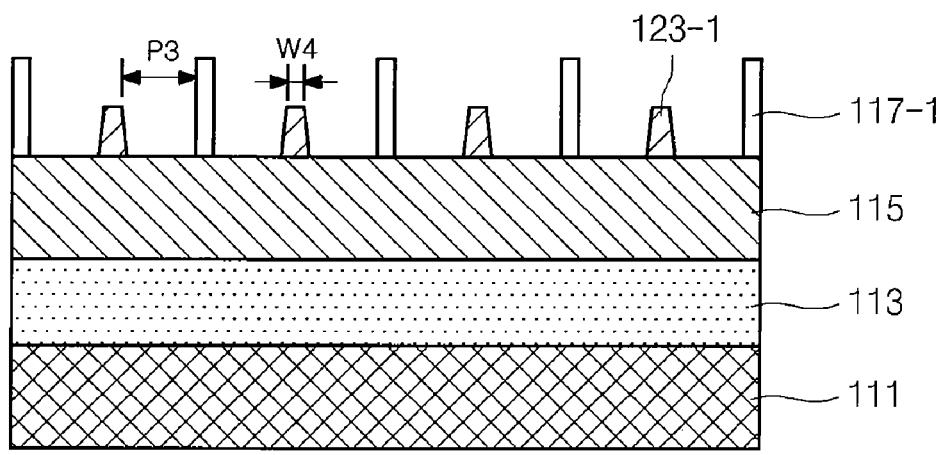

FIG. 1h shows a second hard mask pattern 123-1 of the 2$^{nd}$ layer having a width W4 between the adjacent first hard mask films of the 2$^{nd}$ layer obtained by performing the first and second trimming process on the resulting structure of FIG. 1g.

The width W4 of the second hard mask pattern 123-1 of the 2$^{nd}$ layer is the same as the width (W1) of the first hard mask pattern of the 3$^{rd}$ layer. And the second hard mask pattern and the first hard mask pattern of the 2$^{nd}$ layer is formed with a pitch of P3 (P3=(1/2)P2).

The first and second trimming processes are performed under substantially the same condition as that of the second hard mask film of the 3$^{rd}$ layer.

In the first trimming process, an etching speed of second hard mask pattern of the 2$^{nd}$ layer is approximately nine to ten times faster than the etching speed of the first hard mask pattern of the 2$^{nd}$ layer. The first trimming process is performed using an etching gas selected from the group consisting of $CF_4$, $N_2$, $O_2$, Ar, H and combinations thereof.

In the second trimming process, an etching speed of second hard mask pattern of the 2$^{nd}$ layer is approximately nine to ten times faster than the etching speed of the first hard mask pattern of the 2$^{nd}$ d layer. The first trimming process is performed using an etching gas selected from the group consisting of $CF_4$, $N_2$, $O_2$, Ar, H and combinations thereof.

Figure 1I:
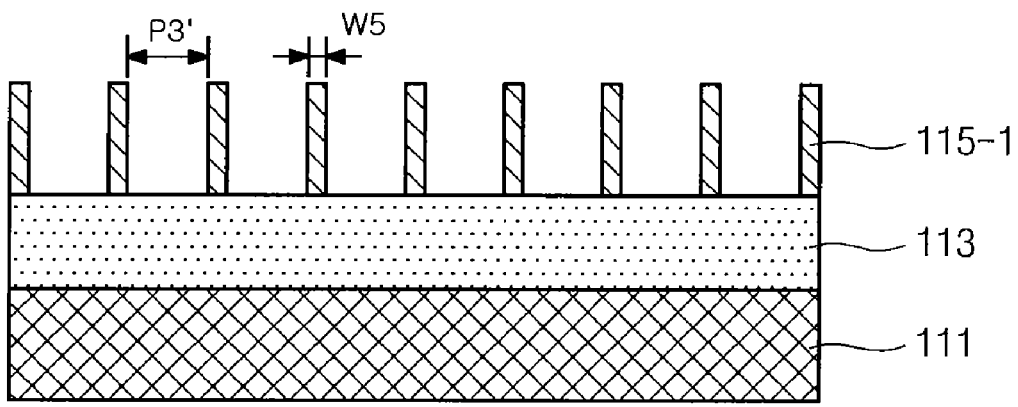

FIG. 1i shows a first hard mask pattern 115-1 having a width W5 obtained by patterning the first hard mask film 115 of the 1$^{st}$ layer. In the pattering process, the first hard mask pattern 117-1 of the 2$^{nd}$ layer and the second hard mask pattern 123-1 of the 2$^{nd}$ layer are used as etching masks.

The first had mask patterns of the 1$^{st}$ layer has pitch P3' (P3'=P3).

Figure 1J:
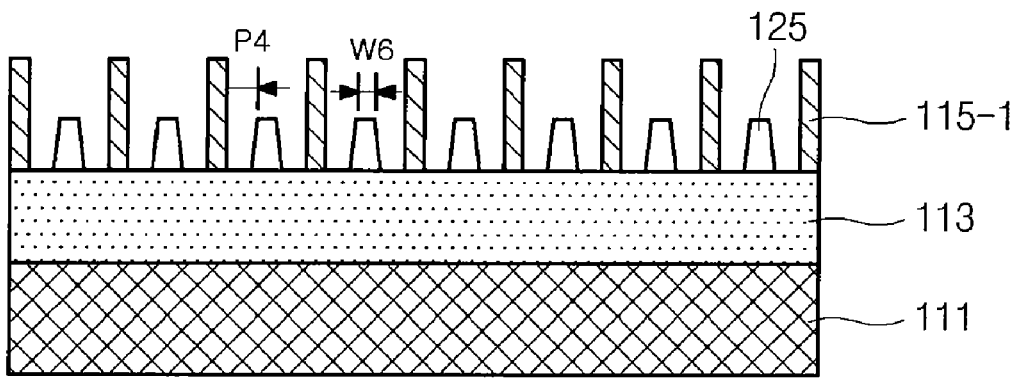

FIG. 1j shows a second hard mask pattern 125 of the 1$^{st}$ layer formed between the adjacent first hard mask patterns 115-1 of the 1$^{st}$ layer.

The first hard mask pattern 1$^{st}$ layer is formed by forming a second hard mask film of the 1$^{st}$ layer over and between the first hard mask pattern 115-1 of the 1$^{st}$ layer. The first hard mask of the 1$^{st}$ layer is partially removed by etch-back process with the second hard mask pattern of the 1$^{st}$ layer as etching masks. The second hard mask pattern of the 1$^{st}$ layer having sloped sidewalls is formed by the first trimming process on the resulting structure. The second hard mask pattern 125 of the 1$^{st}$ layer having a width W6 is formed between the adjacent first hard mask patterns of the 1$^{st}$ layer by the second trimming etching process on the resulting structure.

The width W6 of the second hard mask pattern 125 of the 1$^{st}$ layer is same as the width (W1) of the first hard mask pattern of the 3$^{rd}$ layer. And the second hard mask pattern and first hard mask pattern of the 2$^{nd}$ layer is formed with a pitch of P4(P4=(1/2)P3).

The second hard mask film of the 1$^{st}$ layer is formed from an organic film or an inorganic film.

The etch-back process is performed under substantially the same condition as that of the previous process until the first hard mask pattern of the 1$^{st}$ layer is removed from the top surface by a (1/3) thickness.

The first and second trimming processes are performed under the same condition as that of the previous process.

Figure 1K:
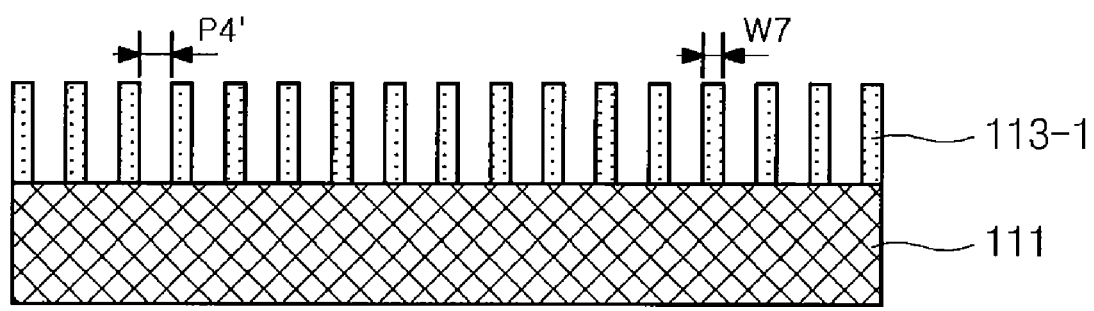

FIG. 1k shows the underlying pattern 113-1 obtained by patterning the underlying layer 113. In the pattering process, the first hard mask pattern 115-1 of the 1$^{st}$ layer and the second hard mask pattern 125 of the 1$^{st}$ layer are used as etching masks.

The width W7 of the underlying pattern is the same as the width W1 of the first hard mask pattern of the 3$^{rd}$ layer. The adjacent underlying pattern has a pitch P4'(P4'=P4).

As described above, the double etching process including the first trimming process and the second trimming process is performed on the multilayer hard mask film. As a result, the second hard mask pattern has a smaller pitch than can be obtained by a conventional lithography device. When the underlying layer is etched with the resulting hard mask pattern, a fine pattern is achieved that cannot be obtained by a conventional lithography device.

Moreover, it is easy to secure the overlapping degree, the arrangement degree and the etching margin for an etching process and it is possible to reduce the manufacturing cost and the process time of semiconductor devices.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the spirit and scope of the appended claims.

What is claimed is:

1. A method for forming a fine pattern of a semiconductor device, the method comprising:
    a) forming a stack structure including a 1$^{st}$ layer hard mask film through an n$^{th}$ layer hard mask film over an underlying layer;
    b) etching the n$^{th}$ layer hard mask film to obtain first hard mask patterns of the n$^{th}$ layer;
    c) forming a second hard mask film of the n$^{th}$ layer over the first hard mask patterns of the n$^{th}$ layer and planarizing the second hard mask film until the first hard mask patterns of the n$^{th}$ layer are exposed;
    d) removing an upper portion of the exposed first hard mask patterns of the n$^{th}$ layer, so that an upper surface of the resulting first hard mask patterns are lower than an upper surface of the second hard mask film of the n$^{th}$ layer;
    e) performing a first trimming process on the second hard mask film of the n$^{th}$ layer to form second hard mask patterns of the n$^{th}$ layer having sloped sidewalls;
    f) performing a second trimming process on the second hard mask patterns of the n$^{th}$ layer to form a third hard mask pattern of the n$^{th}$ layer between each pair of adjacent first hard mask patterns of the n$^{th}$ layer;
    g) patterning an (n−1)$^{th}$ layer hard mask film using the first and the second hard mask patterns of the n$^{th}$ layer as etching masks to form first hard mask patterns of an (n−1)$^{th}$ layer;
    h) repeating the (c) step to the (g) step to form first and second hard mask patterns of the 1$^{st}$ layer over the underlying layer; and
    i) patterning the underlying layer using the first and second hard mask patterns of the 1$^{st}$ layer as etching masks.

2. The method according to claim 1, wherein the n is an integer ranging from 2 to 7.

3. The method according to claim 1, wherein the underlying layer is provided over a semiconductor substrate.

4. The method according to claim 1, wherein each of the stacked hard mask films has a different etch selectivity.

5. A method for forming a fine pattern of a semiconductor device, the method comprising:
   forming a stack structure including a $1^{st}$ layer hard mask film through an $n^{th}$ layer hard mask film over an underlying layer;
   etching a first hard mask film of the $n^{th}$ layer to form a first hard mask pattern of the $n^{th}$ layer having a width of W1 and a thickness of T1;
   forming a second hard mask film of the $n^{th}$ layer over the first hard mask pattern of the $n^{th}$ layer and planarizing the second hard mask film to expose the first hard mask pattern of the $n^{th}$ layer;
   removing the first hard mask pattern by a thickness of T2 from the top surface, wherein 0<T2<T1;
   performing a first trimming process on the second hard mask film of the $n^{th}$ layer until the first hard mask film of an $(n-1)^{th}$ layer is exposed to form a second hard mask pattern of the $n^{th}$ layer having sloped sidewalls;
   performing a second trimming process on the second hard mask pattern to separate the second hard mask pattern of the $n^{th}$ layer from the first hard mask pattern of the $n^{th}$ layer and form a third hard mask pattern having a width of W2;
   patterning the first hard mask film of the $(n-1)^{th}$ layer using the first and the third hard mask patterns of the $n^{th}$ layer as etching masks;
   repeating the hard-mask-pattern-forming-process until the underlying layer is exposed to form a first hard mask pattern of the $1^{st}$ layer having a width of W5 and a third hard mask pattern of the $1^{st}$ layer having a width of W6; and
   patterning the underlying layer using the first and third hard mask patterns of the $1^{st}$ layer as etching masks.

6. The method according to claim 5, wherein the first hard mask pattern of the $n^{th}$ layer is formed to have a pitch of P1,
   the first and third hard mask patterns of the $n^{th}$ layer are formed to have a pitch of P2, where P2=(1/2)P1, and
   the first and third hard mask patterns of the $1^{st}$ layer are formed to have a pitch of P4', where P4'=1/8P1.

7. The method according to claim 5, wherein the T2 is 0<T2≦(1/3)T1.

8. The method according to claim 5, wherein the width W1 is a limit-resolution-size patternable by an exposure equipment used.

9. The method according to claim 5, wherein the width W1 of the first hard mask pattern of the $n^{th}$ layer is substantially the same as the width W2 of the third hard mask pattern of the $n^{th}$ layer, the width W5 of the first hard mask pattern and the width W6 of the third hard mask pattern of the $1^{st}$ layer.

10. The method according to claim 5, wherein the underlying layer is etched to define a word line, a bit line or a metal line.

11. The method according to claim 5, each of the stacked hard mask films has a different etch selectivity.

12. The method according to claim 5, wherein each of the first hard mask films is formed of one of: polysilicon, an oxide film, a nitride film, metal or combinations thereof.

13. The method according to claim 5, wherein the second hard mask film of the $n^{th}$ layer is formed with a material having a different etch selectivity than the etching selectivity of the first hard mask film of the $n^{th}$ layer.

14. The method according to claim 13, wherein the second hard mask film of the $n^{th}$ layer is formed of an organic film or an inorganic film.

15. The method according to claim 14, wherein the organic film is a photoresist film or an anti-reflection film each of which is formed by a spin-coating process.

16. The method according to claim 15, wherein the photoresist film comprises a base resin selected from the group consisting of polyvinyiphenol type, polyhydroxystyrene type, polynorbornene type, polyadamantyl type, polyimide type, polyacrylate type, polymethacrylate type, polyfluorine type and combinations thereof.

17. The method according to claim 15, wherein the anti-reflection film is formed of a resin selected from the group consisting of phenylamine resin, melamine derivative resin, alkali soluble resin, acrylate resin, epoxy resin and combinations thereof.

18. The method according to claim 14, wherein the inorganic film is an oxide film, a nitride film or a polysilicon layer.

19. The method according to claim 5, wherein the removing-the-first-pattern-step is performed using an etching gas selected from the group consisting of $CF_4$, $Cl_2$, HBr and combinations thereof.

20. The method according to claim 5, wherein the first trimming process further comprises etching the second hard mask pattern of the $n^{th}$ layer 9~10 times faster than the first hard mask pattern of the $n^{th}$ layer.

21. The method according to claim 20, wherein the first trimming process is performed using an etching gas selected from the group consisting of $CF_4$, $N_2$, $O_2$, Ar, H and combinations thereof.

22. The method according to claim 21, wherein the first trimming process is performed using an etching gas including $O_2$:$CF_4$:Ar=1:7~10:25~45.

23. The method according to claim 5, wherein the second trimming process further comprises etching the second hard mask pattern of the $n^{th}$ layer 9~10 times faster than the first hard mask pattern of the $n^{th}$ layer.

24. The method according to claim 23, wherein the second trimming process is performed using an etching gas selected from the group consisting of $CF_4$, $N_2$, $O_2$, Ar, H and combinations thereof.

25. The method according to claim 24, wherein the second trimming process is performed using an etching gas including $O_2$:$CF_4$:Ar=1:40~80:25~50.

* * * * *